(12) United States Patent
Nag

(10) Patent No.: US 7,143,378 B1
(45) Date of Patent: Nov. 28, 2006

(54) METHOD AND APPARATUS FOR TIMING CHARACTERIZATION OF INTEGRATED CIRCUIT DESIGNS

(75) Inventor: Sudip K. Nag, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 202 days.

(21) Appl. No.: 10/717,359

(22) Filed: Nov. 18, 2003

(51) Int. Cl.
*G06F 17/50* (2006.01)

(52) U.S. Cl. ............................... 716/6; 716/12; 716/13; 716/14; 716/15

(58) Field of Classification Search .................. 716/5–6, 716/12–14
See application file for complete search history.

(56) References Cited

U.S. PATENT DOCUMENTS

| | | | |
|---|---|---|---|
| 5,659,484 A | * | 8/1997 | Bennett et al. ............... 716/16 |
| 6,701,507 B1 | * | 3/2004 | Srinivasan .................... 716/10 |
| 6,766,504 B1 | * | 7/2004 | Rahut et al. ................... 716/13 |
| 2004/0196081 A1 | * | 10/2004 | Srinivasan et al. ......... 327/165 |

* cited by examiner

*Primary Examiner*—Vuthe Siek
(74) *Attorney, Agent, or Firm*—W. Eric Webostad; Robert Brush

(57) ABSTRACT

Method and apparatus for forming timing parameters for a circuit design having a predefined routing topology within an integrated circuit is described. Sets of timing attributes are determined for the routing topology, each set of timing attributes being associated with one of a plurality of locations within the integrated circuit in which the circuit design may be placed. Timing parameters are formed in response to the sets of timing attributes. The timing parameters are then associated with the routing topology.

20 Claims, 7 Drawing Sheets

US 7,143,378 B1

METHOD AND APPARATUS FOR TIMING CHARACTERIZATION OF INTEGRATED CIRCUIT DESIGNS

FIELD OF THE INVENTION

One or more aspects of the present invention relate generally to computer-aided design of electronic circuits and, more particularly, to timing characterization of integrated circuit designs.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure (routing resources). The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

To implement a circuit design using an FPGA, the design is mapped onto programmable logic blocks, placed within the FPGA, and routed using the programmable fabric. The place and route phases of implementing a circuit design involve generating a layout of the circuit elements on the FPGA and defining the signal lines (routing resources) that connect the elements. Performance and frequency requirements translate to a maximum allowable delay for paths traversing routing resources between circuit elements. For example, FPGAs are operating at ever-increasing frequencies. As such, designers are now concerned about picosecond-accuracy in clock frequency and skew. In addition, as device size increases, the variation of delay values across the device also increases. Thus, designers are beginning to think in terms of minimum-delay and maximum-delay during circuit design.

With conventional timing analysis, after a circuit design is mapped, placed, and routed, signal path delay is determined based on assigned costs to the physical resources of an FPGA ("resource costs"). The resource costs are based on the type of routing resource and are standard across many types of devices. For particular circuit elements, such as a local clock net, this approach has severe limitations. First, using generic resource costs, the minimum-delay value for a path will be a fraction of the maximum-delay value for the path. The fraction is determined based on an analysis of a large number of paths across many FPGAs. Thus, the minimum-delay value is typically a worst-case number. Second, the worst-case minimum-delay value results in a conservative clock skew calculation. As such, a circuit design may not exhibit optimal performance.

Accordingly, there exists a need in the art for timing characterization of an integrated circuit design that overcomes the disadvantages associated with the use of generic resource cost values during timing analysis.

SUMMARY OF THE INVENTION

An aspect of the invention is a method and apparatus for forming timing parameters for a circuit design having a predefined routing topology within an integrated circuit. Sets of timing attributes are determined for the routing topology, each set of timing attributes being associated with one of a plurality of locations within the integrated circuit in which the circuit design may be placed. Timing parameters are formed in response to the sets of timing attributes. The timing parameters are then associated with the routing topology.

Another aspect of the invention is a method and apparatus for analyzing timing of a circuit design associated with a template having a predefined routing topology within an integrated circuit. Sets of timing attributes are determined for the routing topology, each set of timing parameters being associated with one of a plurality of locations within the integrated circuit in which the template may be placed. Timing parameters are formed in response to the sets of timing attributes. The timing parameters are then associated with the routing topology. The circuit design is placed and routed based on the template. The circuit design is then analyzed using the timing parameters.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for timing characterization of an integrated circuit design is described. One or more aspects in accordance with the invention are described in terms a field programmable gate array (FPGA). While specific reference is made to an FPGA, those skilled in the art will appreciate that one or more aspects of the invention may be used for timing characterization of circuit designs for other types of integrated circuits, such as complex programmable logic devices (CPLDs).

Figure 1:
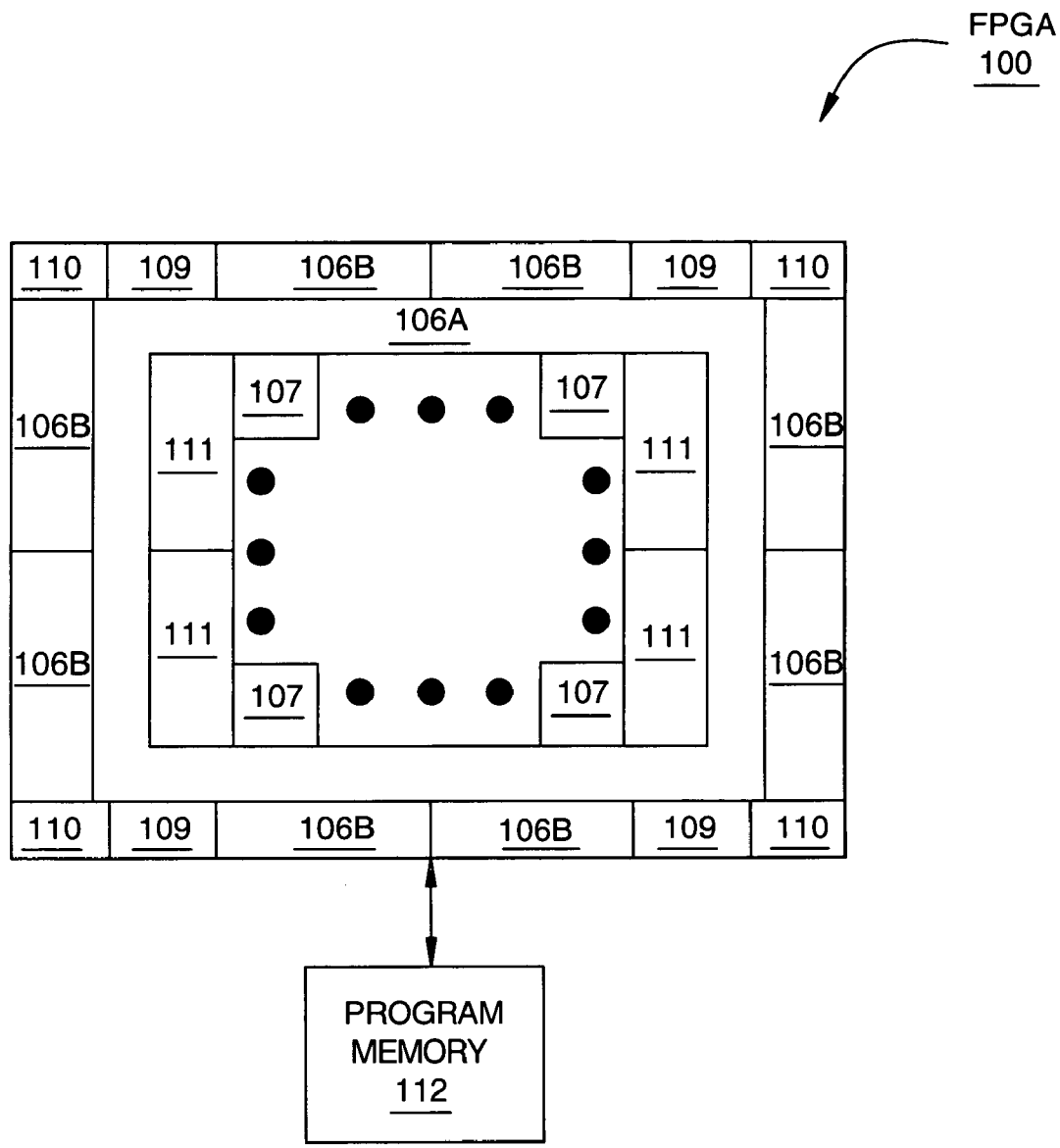
FIG. 1 is a block diagram depicting an exemplary embodiment of a field programmable gate array (FPGA) coupled to a program memory.

FIG. 1 depicts a block diagram of an exemplary embodiment of a field programmable gate array (FPGA) 100 coupled to a program memory 112. FPGA 100 illustratively includes CLBs 107, I/O routing ring 106A ("programmable interconnect"), memory 111, such as random access memory, delay lock loop (DLL) blocks 109, multiply/divide/de-skew clock circuits 110, and programmable IOBs 106B. DLL blocks 109 and clock circuits 110 collectively provide digital clock management (DCM) circuits for managing clock signals within FPGA 100. FPGA 100 may include other types of logic blocks and circuits in addition to those described herein.

CLBs 107 are programmably connectable to each other, and to I/O routing ring 108, for performing various types of logic functions. Each of CLBs 107 may include one or more "slices" and programmable interconnect circuitry (not shown). Each CLB slice in turn includes various circuits, such as flip-flops, function generators (e.g., look-up tables (LUTs)), logic gates, memory, and like type well-known circuits.

Programmable IOBs 106B are configured to provide input to, and receive output from, one or more of CLBs 107. Configuration information for CLBs 107, I/O routing ring 106A, and programmable IOBs 106B is stored in memory 111. Briefly stated, a configuration bitstream produced from program memory 112 is coupled to a configuration port of FPGA 100 to implement a desired circuit therein. Each of CLBs 107, I/O routing ring 106A, and programmable IOBs 106B are generally referred to herein as "programmable logic blocks".

Figure 2:
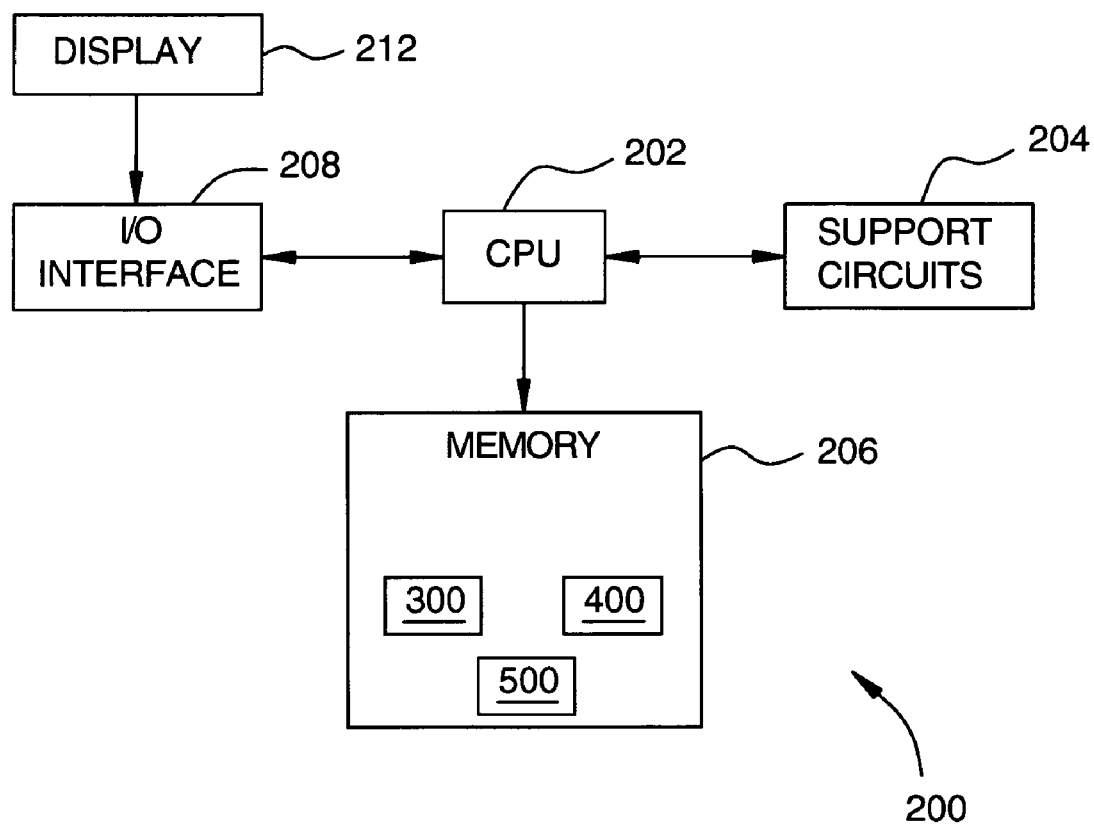
FIG. 2 depicts a block diagram showing an exemplary embodiment of a computer system suitable for implementing processes and methods described herein.

FIG. 2 depicts a block diagram showing an exemplary embodiment of a computer system 200 suitable for implementing processes and methods described below. Computer system 200 includes a central processing unit (CPU) 202, a memory 206, a variety of support circuits 204, and an I/O interface 208. CPU 202 may be any type of microprocessor known in the art. Support circuits 204 for CPU 202 include conventional cache, power supplies, clock circuits, data registers, I/O interfaces, and the like. I/O interface 208 may be directly coupled to memory 206 or coupled through CPU 202, and may be coupled to a conventional keyboard, network, mouse, printer, and interface circuitry adapted to receive and transmit data, such as data files and the like. I/O interface 208 may be coupled to a display 212.

Memory 206 may store all or portions of one or more programs and/or data to implement the processes and methods described below. Although the invention is disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 206. Memory 206 may include one or more of the following random access memory, read only memory, magneto-resistive read/write memory, optical read/write memory, cache memory, magnetic read/write memory, and the like, as well as signal-bearing media as described below. Memory 206 may store all or a portion of integrated circuit modeling system 300 of FIG. 3. Memory 206 may store all or a portion of template process 400 or process 500, described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
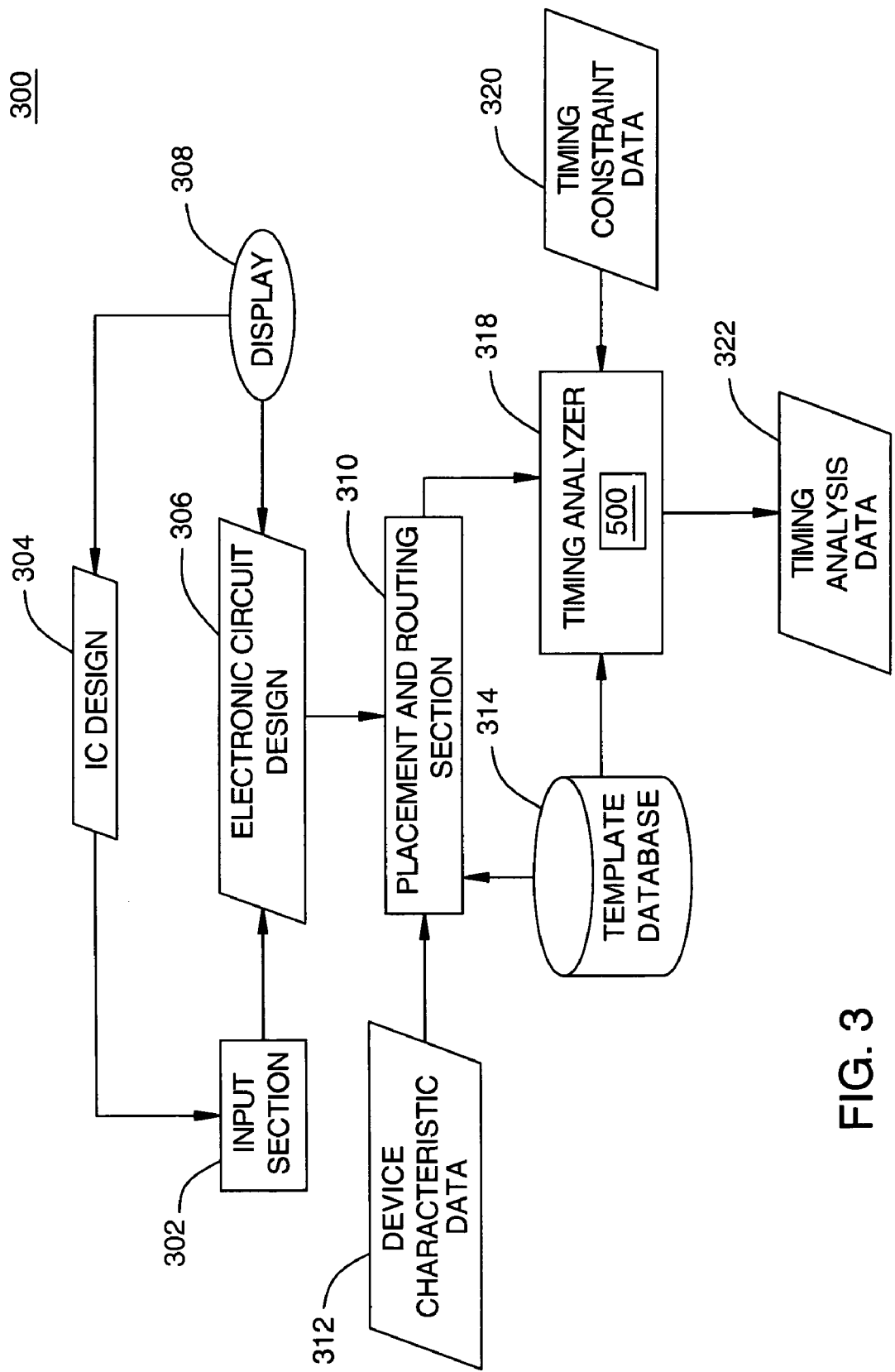
FIG. 3 depicts a high-level block diagram showing an exemplary embodiment of an integrated circuit modeling system.

FIG. 3 depicts a high-level block diagram showing an exemplary embodiment of an integrated circuit modeling system 300. Modeling system 300 includes an input section 302, a display 308, a placement and routing section 310, and a timing analyzer 318. In an embodiment, modeling system 300 is implemented using computer system 200 of FIG. 2. Notably, input section 302, placement and routing section 310, and timing analyzer 318 may be all or portions of one or more programs stored within memory 206 and executed by CPU 202.

An IC design 304 is input, such as at a schematic or logic level, to modeling system 300 using input section 302 and display 308. Input section 302 produces data 306 that includes an electronic representation of IC design 304 ("electronic circuit design 306"). Electronic circuit design 306 may be schematically represented on display 308.

Placement and routing section 310 receives electronic circuit design 306. Placement and routing section 310 generates a layout and defines the signal routing of the circuit design embodied by electronic circuit design 306. Notably, placement and routing section 310 receives device characteristic data 312. Device characteristic data 312 includes data associated with the physical configuration of the device to be programmed (e.g., number and types of routing resources and configurable logic resources).

Figure 6:
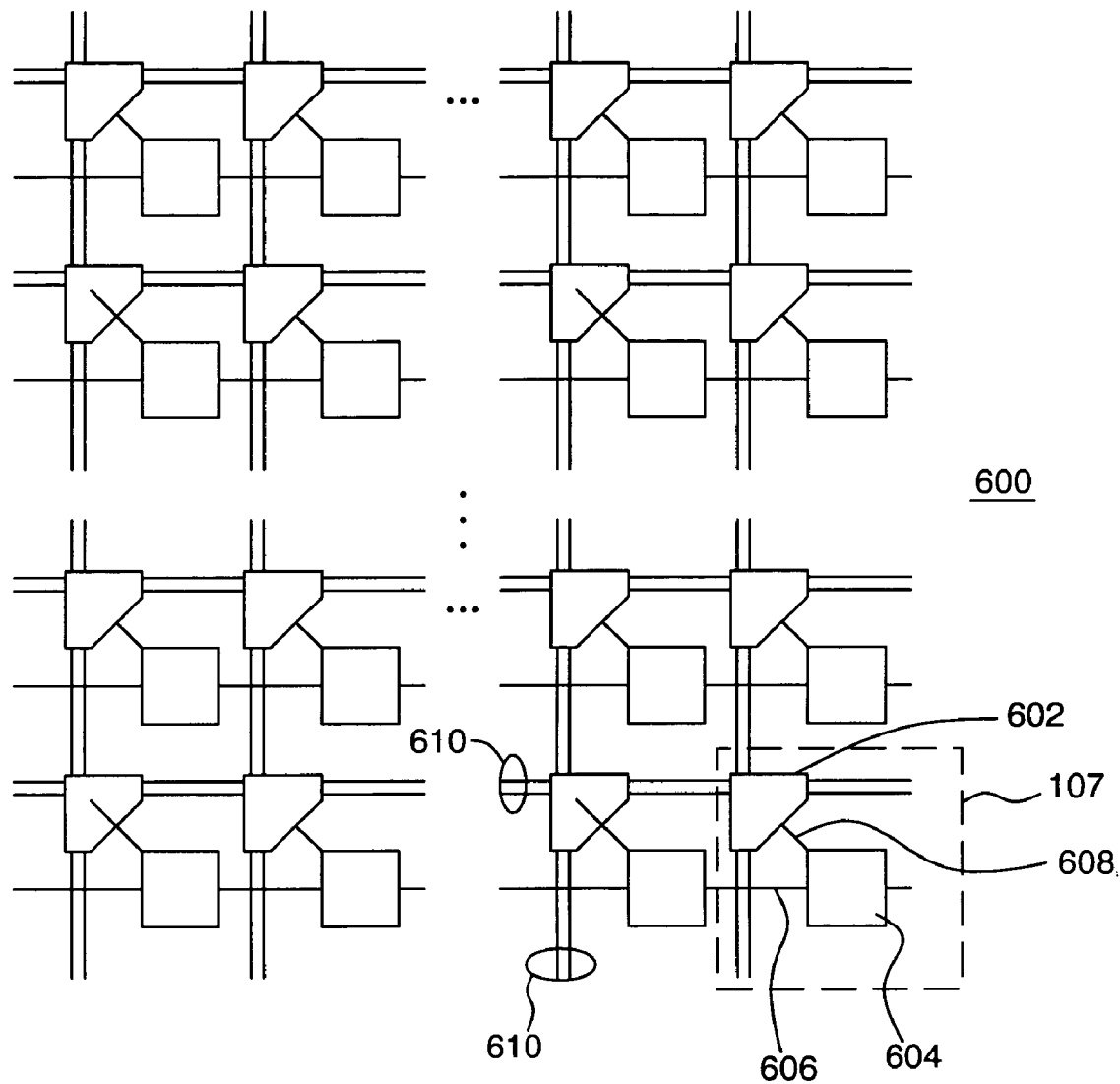
FIG. 6 is a more detailed block diagram depicting an exemplary embodiment of configurable logic blocks and routing resources for an FPGA.

FIG. 6 is a more detailed block diagram depicting an exemplary embodiment of a portion 600 of FPGA 100. Portion 600 includes an array of CLBs 107. Each CLB 107 includes a routing matrix 602 and a logic portion 604. Each logic portion 604 includes configurable direct connections 606 to horizontally adjacent logic portions 604. Input and output ports of each logic portion 604 may be configured to connect to routing matrix 602 via signal lines 608.

Each routing matrix 602 is a switch matrix through which horizontal and vertical routing resources connect, and is also the means by which their respective logic portions 604 gain access to the general purpose routing. The general purpose routing resources of routing matrices 602 may include single-length lines ("single lines"), hex-length lines ("hex lines"), and long lines. Lines 610 represent the collection of single, hex, and long lines to adjacent GRMs in the four directions (north, south, east, and west), respectively. Within each routing matrix 602, the single lines, hex lines, and long lines can be selectively connected to in order to interconnect input and output ports of selected logic portions 604.

Returning to FIG. 3, placement and routing section 310 defines a layout for the electronic circuit design in terms of programmable logic blocks, such as CLBs 107, and defines signal routing for the electronic circuit design in terms of the horizontal and vertical routing resources. Some components of electronic circuit design 306 may be associated with templates stored in a template database 314. A template includes pre-defined routing information ("routing topology") for one or more circuit components, as well as predetermined timing parameters. For a circuit component(s) that is associated with a template in template database 314, placement and routing section 310 will generate a layout and define signal routing for that component(s) in accordance with the template.

In an embodiment, a template includes one or more source pins and a plurality of sink pins. A "pin" is a resource within FPGA 100 that may be a source or a sink of a signal (e.g., input and output portions of the logic portion of a CLB). The pins are defined based on a geometric relationship (e.g., RPM grid of the FPGA). The template also includes an ordered set of types of routing resources to be followed in routing from a source to a sink (e.g., hex lines, single lines, long lines, etc). As such, a template includes a complete routing topology for a particular circuit component(s). Note that, in some cases, a template may only be valid for particular locations within the device (e.g., a particular number of CLB columns), rather than the entire device (e.g., the entire CLB array).

A template also includes predetermined timing parameters. For example, a template may be used for a local clock net. In this case, the template timing parameters may define a delay range and maximum clock skew for any local clock net based on the template. Notably, the delay range and maximum clock skew will be valid for any placement of the local clock net that comports with the possible placements of the template. Thus, regardless of the chosen placement for the local clock net, timing results can be reported for the local clock net without performing a conventional timing analysis based on generic resource cost assignments using timing analyzer 318.

A template may be a maximal template, comprising all source-sink pairs that may be part of the associated circuit component. In some cases, a design may require only a portion of the template, as not all the source-sink pairs may be required for a particular implementation of the circuit component. The routing topology and timing parameters of the template remain valid for a circuit component(s) based on the entire template or any subset of the template.

Figure 4:
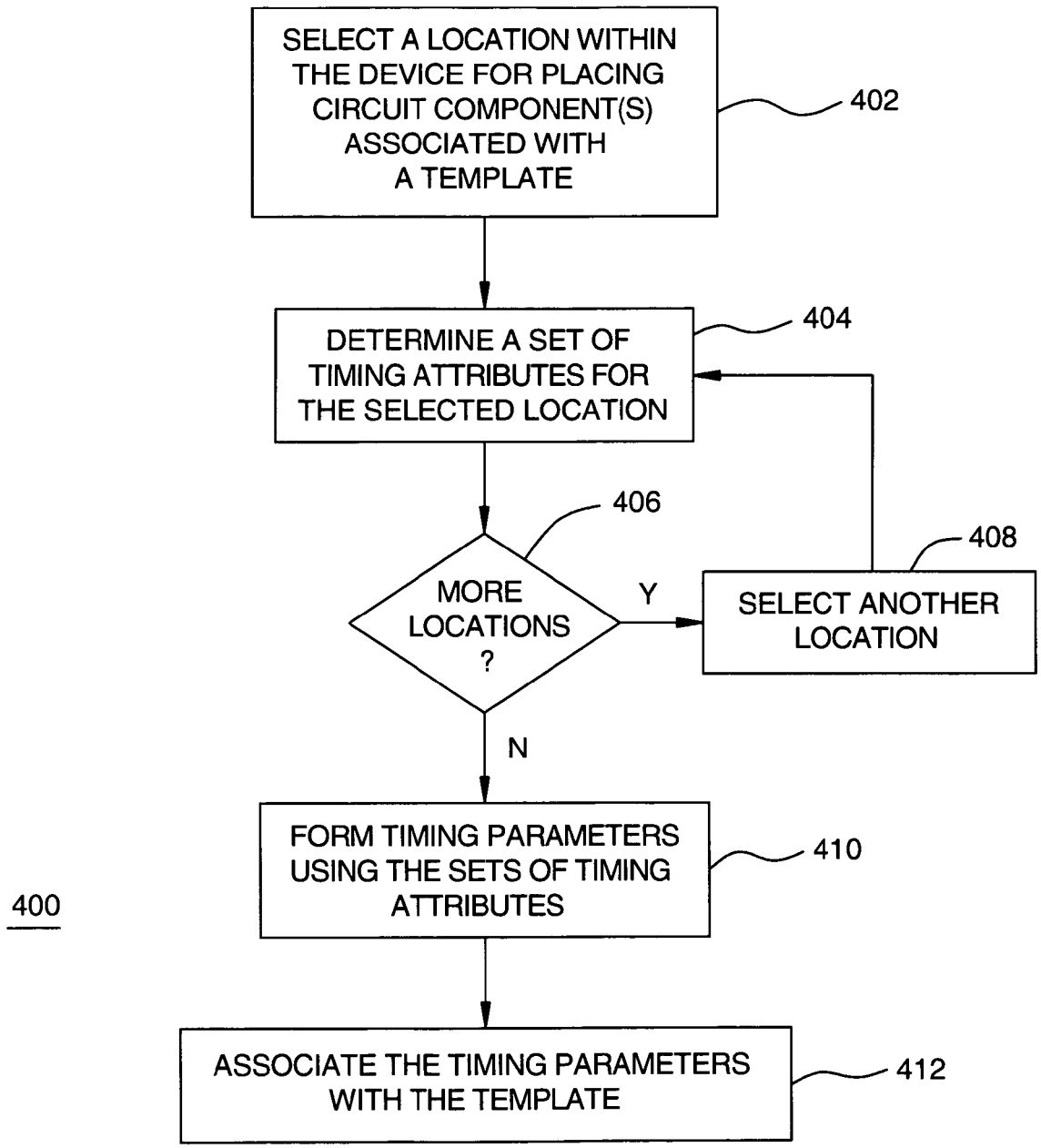
FIG. 4 is a flow diagram depicting an exemplary embodiment of a process for timing parameters for a template.

FIG. 4 is a flow diagram depicting an exemplary embodiment of a process 400 for producing timing parameters for a template. Process 400 begins at step 402, where a location in the device is selected for placing a circuit component(s) based on a template. At step 404, a set of timing attributes is determined for the circuit component(s) associated with the template at the selected location within the device. At step 406, a determination is made as to whether additional locations within the device are to be selected. Notably, as described above, a template may be valid for several locations within the device. If so, process 400 proceeds to step 408, where another location is selected within the device. If not, process 400 proceeds to step 410, where timing parameters are formed using the sets of timing attributes. At step 414, the timing parameters are associated with the template and the template is stored within a database for access by a placement and routing process and a timing analysis process.

Returning to FIG. 3, timing analyzer 318 receives the output of placement and routing section 310. Timing analyzer 318 is also coupled to template database 314. Timing analyzer 318 executes a process 500 for analyzing timing characteristics of electronic circuit design 306 using timing constraint data 320 as parametric input. An embodiment of process 500 is described below with respect to FIG. 5. For portions of electronic circuit design 306 that are not associated with templates, timing analyzer 318 performs a static timing analysis in a conventional manner using timing constraint data 320. Notably, timing analysis may be performed using generic resource cost values. If a circuit component(s) of electronic circuit design 306 has an associated template, timing analyzer 318 does not perform a timing analysis in the conventional manner. Rather, the timing analyzer 318 uses the predefined timing parameters of the template, as described below. Timing analyzer 318 produces timing analysis data 322.

Figure 5:
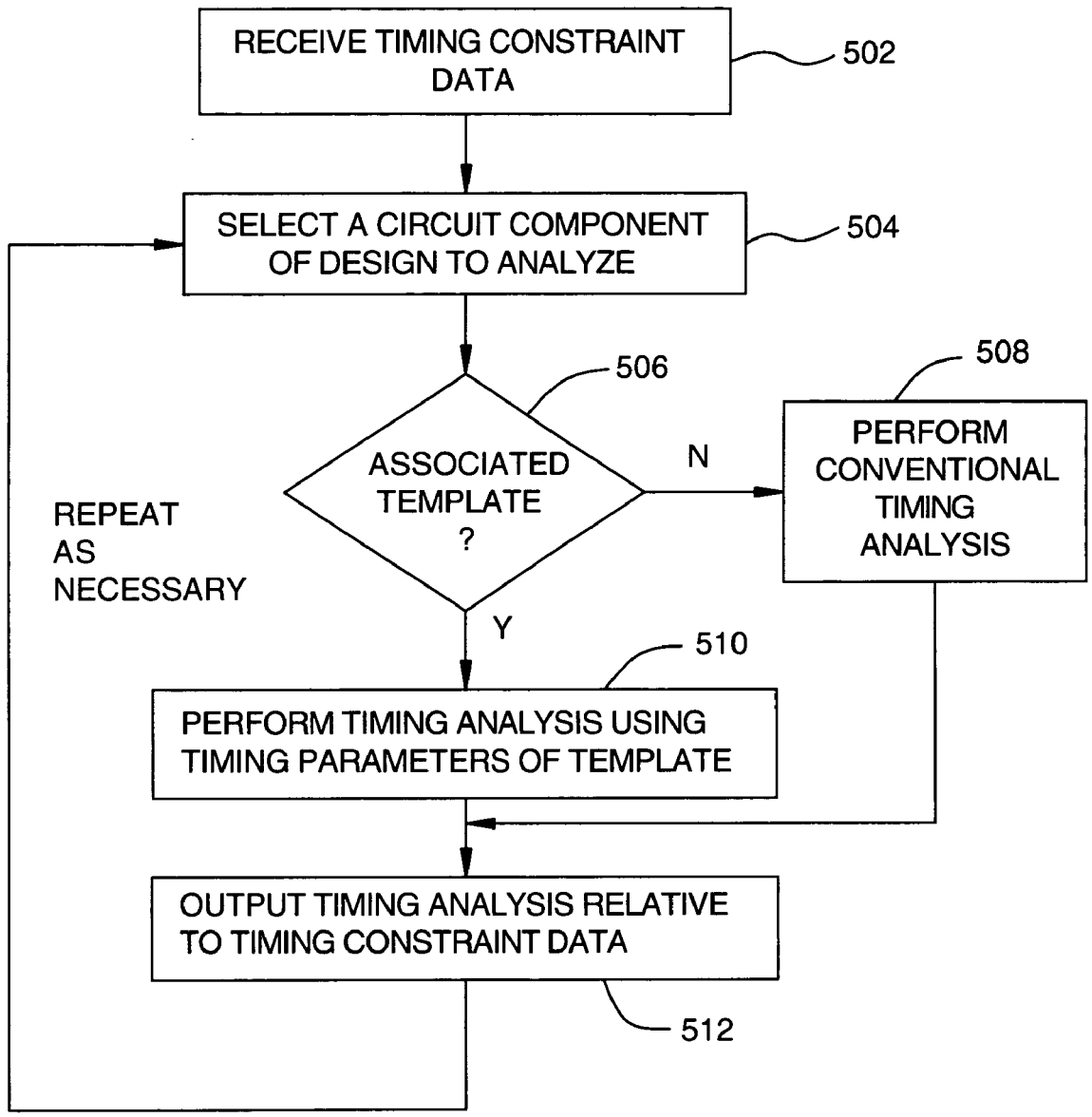
FIG. 5 is a flow diagram depicting an exemplary embodiment of a process for analyzing timing characteristics of a circuit design.

FIG. 5 depicts a flow diagram showing an exemplary embodiment of a process 500 for analyzing timing characteristics of a circuit design. Process 500 begins at step 502, where timing constraint data is received for the circuit design. At step 504, a circuit component of the design is selected for analysis. At step 506, a determination is made as to whether the selected circuit component is associated with a template having a timing model. If not, process 500 proceeds to step 508, where a conventional timing analysis is performed. If so, process 500 proceeds to step 510, where a timing analysis is performed using the timing parameters of the template. At step 512, timing analysis data is provided relative to the timing constraint data. Process 500 may be repeated for additional circuit components of the circuit design.

Templates may be used for circuit components requiring specific placed/routed solutions with specific timing requirements dictated by performance and timing constraints. For example, templates may be used to route local clock nets (i.e., clock nets that do not utilize dedicated resources within the FPGA) or high-performance cores. By characterizing templates directly with timing parameters, timing analysis may be performed on the associated circuit component without using generic resource cost assignments. In addition, since the timing parameters are predetermined for the template, the timing parameters are valid for any circuit component based on the template, regardless of the eventual placement and routing of the circuit component.

Process 400 and process 500 may be more thoroughly understood with reference to the following example. A template T1 for a local clock net includes a source S and n sinks L1 through Ln, where n is an integer greater than 0. The local clock net is placed at a selected location within the device and timing attributes for each source-sink pair are measured to form a set of timing attributes. For example, signal delay and clock skew for each source-sink pair may be identified using device characteristic data. For a given sink Li, clock skew may be computed as signal delay between source S and sink Li minus the minimum of all the signal delays for the source-sink pairs in the template. The local clock net is then placed at additional locations within the device and additional sets of timing attributes are computed. For example, the total number of locations chosen may be equal to the total number of possible locations of the template within the device.

Template timing parameters may be computed from the sets of timing attributes as follows. For a given sink Li, a minimum signal delay from source S to sink Li is selected from all signal delays computed between source S and sink Li (i.e., the signal delays between S and Li identified for all locations). A maximum signal delay from source S to sink Li is selected from all signal delays computed between source S and sink Li. A maximum clock skew is selected from all clock skews computed at sink Li. Thus, template timing parameters include a minimum signal delay, a maximum signal delay, and a clock skew for each source-sink pair in the template that are valid for various placements of the template within the device. In this manner, a pre-determined set of timing parameters is generated for the template that hold true for any local clock net employed within the device that is based on the template, regardless of where the local clock net is placed.

As discussed above, the template is typically a maximal template, comprising all source-sink pairs that may be part of the local clock net. In some cases, however, a design may require only a portion of template T1, as not all the source-sink pairs may be required for a particular implementation of the local clock net. The timing parameters associated with the template remain valid for the entire template or any portion of the template that is used during implementation of the local clock net.

When the local clock net is used within a circuit design, the local clock net will be mapped, placed, and routed with the rest of the circuit design, and timing analysis may be performed. Since placement and routing for the local clock net is based on a template, the local clock net will be placed and routed in accordance with the routing topology of the template. Also, the timing analyzer does not perform a conventional timing analysis on the local clock net during the process of placement and routing. Instead, the template timing parameters are used to quote the maximum signal delay, the minimum signal delay, and the maximum clock skew for a given source-sink pair of the local clock net.

For example, the timing analyzer may produce "slack" values for the local clock net. Slack is the difference between the maximum signal delay allowed between a source-sink pair and the actual delay associated with the source-sink pair. The maximum allowable signal delay is typically specified in the timing constraint data.

Figure 7A:
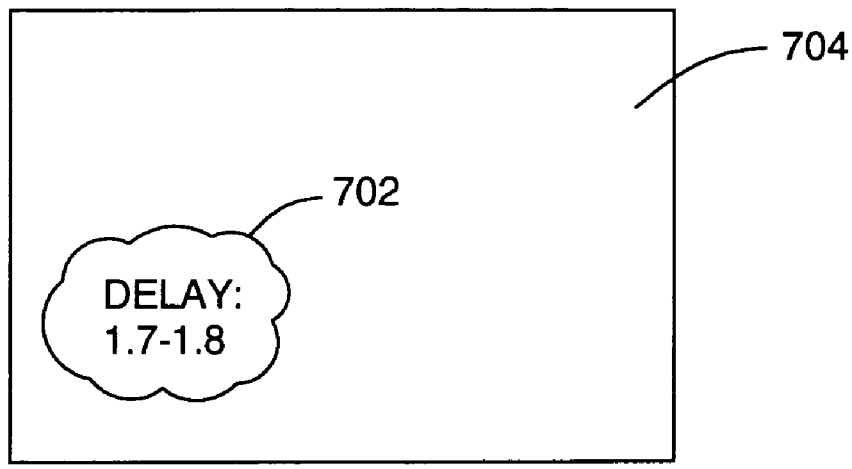
FIGS. 7A and 7B are a block diagrams depicting an example of a process for producing timing parameters for a local clock net template.
Figure 7B:
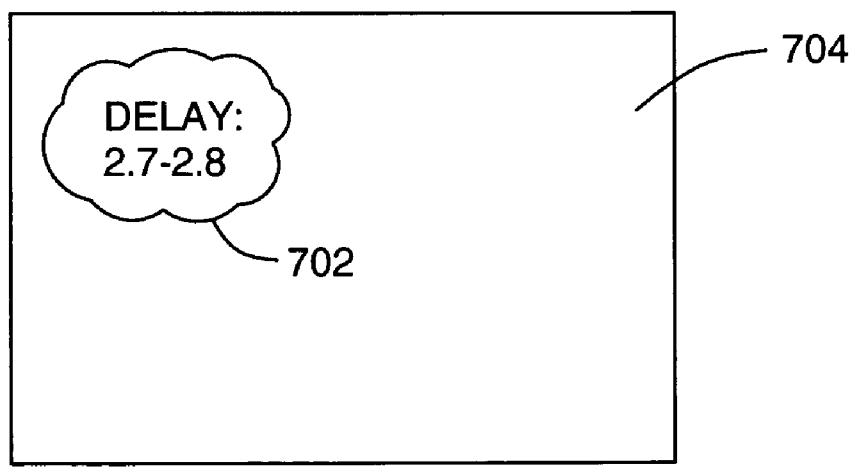

FIGS. 7A and 7B are a block diagrams depicting an example of the process for producing timing parameters for a local clock net template 702 related to a device 704. Local clock net template 702 includes a source S and sinks L1 through L10. As shown in FIG. 7A, when local clock net template 702 is placed in the bottom-left of device 704, the measured delay variation among sinks L1 through L10 is 1.7–1.8 nanoseconds. As shown in FIG. 7B, when local clock net 702 is placed in the top-left of device 704, the measured delay variation among sinks L1 through L10 is 2.7–2.8 nanoseconds.

Assume sink L1 has a signal delay of 1.75 nanoseconds when local clock net template 702 is placed as in FIG. 7A. At this point, for the sink L1, the timing parameters include a minimum delay of 1.75 ns, a maximum delay of 1.75 ns, and a maximum clock skew of 0.05 ns. The minimum and maximum delays are identical to the identified delays, since only a single location within device 704 has been processed. Assume sink L1 has a signal delay of 2.72 ns when local clock net template 702 is placed as in FIG. 7B. Now, for the sink L1, the timing parameters include a minimum delay of 1.75 ns, a maximum delay of 2.72 ns, and a maximum clock skew of 0.08 ns. This process is repeated for additional locations in device 704.

Method and apparatus for timing characterization of integrated circuit designs has been described. In an embodiment, a template for routing and placement of a circuit component is characterized to produce timing parameters. The timing parameters include timing attributes, such as maximum delay, minimum delay, and clock skew, for a particular circuit component. When the circuit component is placed and routed using the template, timing analysis may be performed using the timing parameters of the template. This obviates the need to perform timing analysis using generic resource cost assignments. As such, high-performance circuits, such as local clock nets, may be characterized with more precision.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of forming timing parameters for a circuit design associated with a template having a predefined routing topology within an integrated circuit, the method comprising:

determining sets of timing attributes for the routing topology, each set of timing attributes being associated with one of a plurality of locations within the integrated circuit in which the circuit design is placeable;

forming timing parameters in response to the sets of timing attributes; and associating the timing parameters with the routing topology.

2. The method of claim 1, wherein the routing topology comprises a source and at least one sink, and wherein each set of timing attributes comprises a signal delay between each source-sink pair.

3. The method of claim 2, wherein the forming timing parameters comprises:

selecting a minimum delay in response to the signal delay for each source-sink pair in each set of timing attributes; and selecting a maximum delay in response to the signal delay for each source-sink pair in each set of timing attributes.

4. The method of claim 3, wherein the source provides a clock signal to the at least one sink and wherein each set of timing attributes further comprises a clock skew for each source-sink pair.

5. The method of claim 4, wherein the forming further comprises selecting a maximum skew in response to the clock skew for each source-sink pair in each set of timing attributes.

6. The method of claim 1, wherein the integrated circuit is a programmable logic device, and where each of the plurality of locations is defined by a group of programmable logic blocks.

7. The method of claim 6, wherein the circuit design comprises at least one clock net.

8. A method of analyzing timing of a circuit design associated with a template having a predefined routing topology within an integrated circuit, the method comprising:

determining sets of timing attributes for the routing topology, each set of timing attributes being associated with one of a plurality of locations within the integrated circuit in which the template is applicable;

forming timing parameters in response to the sets of timing attributes;

associating the timing parameters with the routing topology;

placing and routing the circuit design within the integrated circuit based on the template; and analyzing the circuit design using the timing parameters.

9. The method of claim 8, wherein the routing topology comprises a source and at least one sink, and wherein each set of timing attributes comprises a signal delay between each source-sink pair.

10. The method of claim 9, wherein the forming timing parameters comprises:

selecting a minimum delay in response to the signal delay for each source-sink pair in each set of timing attributes; and selecting a maximum delay in response to the signal delay for each source-sink pair in each set of timing attributes.

11. The method of claim 10, wherein the source provides a clock signal to the at least one sink and wherein each set of timing attributes further comprises a clock skew for each source-sink pair.

12. The method of claim 11, wherein the forming further comprises selecting a maximum skew in response to the clock skew for each source-sink pair in each set of timing attributes.

13. The method of claim 8, wherein the integrated circuit is a programmable logic device, and where each of the plurality of locations is defined by a group of programmable logic blocks.

14. The method of claim 13, wherein the circuit design comprises at least one clock net.

15. An apparatus for forming timing parameters for a circuit design associated with a template having a predefined routing topology within an integrated circuit, the apparatus comprising:

means for determining sets of timing attributes for the routing topology, each set of timing attributes being associated with one of a plurality of locations within the integrated circuit in which the template is applicable; and means for forming timing parameters in response to the sets of timing attributes.

16. The apparatus of claim 15, further comprising:

means for placing and routing the circuit design within the integrated circuit based on the template; and means for analyzing the circuit design using the timing parameters.

17. A computer readable medium having stored thereon instructions that, when executed by a processor, cause the processor to perform a method of forming timing parameters for a circuit design associated with a template having a predefined routing topology within an integrated circuit, the method comprising:

determining sets of timing attributes for the routing topology, each set of timing attributes being associated with one of a plurality of locations within the integrated circuit in which the template is applicable;

forming timing parameters in response to the sets of timing attributes; and associating the timing parameters with the routing topology.

18. The computer readable medium of claim 17, further comprising:

placing and routing the circuit design within the integrated circuit based on the template; and analyzing the circuit design using the timing parameters.

19. A system for forming timing parameters for a circuit design associated with a template having a predefined routing topology within an integrated circuit, the system comprising:

a processing unit having access to one or more storage devices;

at least a portion of the one or more storage devices having a program product configured to:

determine sets of timing attributes for the routing topology, each set of timing attributes being associated with one of a plurality of locations within the integrated circuit in which the template is applicable;

form timing parameters in response to the sets of timing attributes; and associate the timing parameters with the routing topology.

20. The system of claim 19, wherein the program product is further configured to:

place and route the circuit design within the integrated circuit based on the template; and analyze the circuit design using the timing parameters.

* * * * *